(12) United States Patent
Bai

(10) Patent No.: US 12,068,328 B2
(45) Date of Patent: Aug. 20, 2024

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Sihang Bai, Wuhan (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 332 days.

(21) Appl. No.: 17/286,459

(22) PCT Filed: Mar. 22, 2021

(86) PCT No.: PCT/CN2021/082009
§ 371 (c)(1),
(2) Date: Apr. 17, 2021

(87) PCT Pub. No.: WO2022/188204
PCT Pub. Date: Sep. 15, 2022

(65) Prior Publication Data
US 2023/0154930 A1 May 18, 2023

(30) Foreign Application Priority Data
Mar. 8, 2021 (CN) .......................... 202110248869.8

(51) Int. Cl.
H01L 27/12 (2006.01)
H01L 29/417 (2006.01)

(52) U.S. Cl.
CPC ...... *H01L 27/1225* (2013.01); *H01L 27/1229* (2013.01); *H01L 27/124* (2013.01); *H01L 27/1255* (2013.01); *H01L 29/41733* (2013.01)

(58) Field of Classification Search
CPC ............. H01L 27/1225; H01L 27/1229; H01L 27/124; H01L 27/1255; H01L 29/41733
(Continued)

(56) References Cited

U.S. PATENT DOCUMENTS 10,013,124 B2 * 7/2018 Lou ...................... G06F 3/04164
2015/0243719 A1 * 8/2015 Kwon ................. H01L 27/1248
257/43
(Continued)

FOREIGN PATENT DOCUMENTS

CN 207009438 U 2/2018
CN 108376672 A 8/2018
(Continued)

OTHER PUBLICATIONS

Chinese Office Action in corresponding Chinese Patent Application No. 202110248869.8 dated May 5, 2022, pp. 1-9.
(Continued)

*Primary Examiner* — Ori Nadav
(74) *Attorney, Agent, or Firm* — PV IP PC; Wei Te Chung; Zhigang Ma

(57) ABSTRACT

A display panel and a display device are provided. By manufacturing a first via hole and a second via hole first, and then manufacturing a third via hole and a fourth via hole, the first via hole and the second via hole have been covered by a corresponding first drain electrode and first source electrode before performing hydrofluoric acid cleaning processes, and a first drain region and a first source region of a first oxide transistor are not affected by the hydrofluoric acid cleaning process, thereby allowing an oxide channel of the (Continued)

first oxide transistor to also be prevented from being affected.

18 Claims, 5 Drawing Sheets

(58) Field of Classification Search
USPC .......................................................... 257/59
See application file for complete search history.

(56) References Cited

U.S. PATENT DOCUMENTS

| | | |
|---|---|---|
| 2016/0197196 A1 | 7/2016 | Oh et al. |
| 2017/0162606 A1 | 6/2017 | Yan et al. |
| 2017/0338249 A1 | 11/2017 | Suzumura et al. |
| 2017/0338252 A1 | 11/2017 | Lee et al. |
| 2020/0357829 A1* | 11/2020 | Yang .................... H01L 27/1259 |
| 2021/0013280 A1* | 1/2021 | Choi .................. H10K 59/1213 |

FOREIGN PATENT DOCUMENTS

| | | |
|---|---|---|
| CN | 109887935 A | 6/2019 |
| CN | 110164868 A | 8/2019 |
| CN | 110491887 A | 11/2019 |
| CN | 110634888 A | 12/2019 |
| CN | 110828477 A | 2/2020 |
| CN | 111564458 A | 8/2020 |
| KR | 20160085402 A | 7/2016 |
| WO | 2016108464 A1 | 7/2016 |

OTHER PUBLICATIONS

International Search Report in International application No. PCT/CN2021/082009, mailed on Nov. 25, 2021.
Written Opinion of the International Searching Authority in International application No. PCT/CN2021/082009, mailed on Nov. 25, 2021.

* cited by examiner

DISPLAY PANEL AND DISPLAY DEVICE

RELATED APPLICATIONS

This application is a Notional Phase of PCT Patent Application No. PCT/CN2021/082009 having international filing date of Mar. 22, 2021, which claims the benefit of priority of Chinese Patent Application Nos. 202110248869.8 filed on Mar. 8, 2021. The contents of the above applications are all incorporated by reference as if fully set forth herein in their entirety.

BACKGROUND OF INVENTION

Field of Invention

The present disclosure relates to the field of display technology, and specifically to a display panel and a display device.

Description of Prior Art

As illustrated in FIG. 1, a low temperature polycrystalline oxide (LTPO) display panel of a traditional technical solution generally at least includes one oxide thin film transistor M2 and one polycrystalline silicon thin film transistor M1. The oxide thin film transistor M2 includes an oxide active layer. The oxide active layer includes a second drain region M2D and a second source region M2S. The polycrystalline silicon thin film transistor M1 includes a polycrystalline silicon active layer. The polycrystalline silicon active layer includes a first drain region M1D, a first source region M1S, and a polycrystalline silicon channel. A metal layer is generally disposed in the display panel. A first drain electrode Y2, a first source electrode Y1, a second drain electrode Y4, and a second source electrode Y3 are correspondingly disposed in the metal layer. The first drain region M1D is connected to the first drain electrode Y2 through a first via hole H2. The first source region M1S is connected to the first source electrode Y1 through a second via hole H1. The second drain region M2D is connected to the second drain electrode Y4 through a third via hole H4. The second source region M2S is connected to the second source electrode Y3 through a fourth via hole H3.

Wherein, the first via hole H2, the second via hole H1, the third via hole H4, and the fourth via hole H3 are generally manufactured at a same time. After that, in order to relieve overlapping impedance between polycrystalline silicon channels and the aforesaid metal layer, hydrofluoric acid (HFC) is generally used to clean the first via hole H2 and/or the second via hole H1 to remove an original oxide layer structure. However, at least one of an oxide channel of the oxide thin film transistor M1, the second drain region M2D, or the second source region M2S has weak cleaning resistance to the hydrofluoric acid, making device characteristics of the oxide thin film transistor M2 easily affected.

SUMMARY OF INVENTION

The present disclosure provides a display panel and a display device, which solve the problem that the device characteristics of oxide transistors are easily affected by the hydrofluoric acid cleaning process during manufacturing processes of display panels.

On a first aspect, the present disclosure provides a display panel, including a first oxide transistor, a first conductive layer, a first polycrystalline silicon transistor, and a second conductive layer. The first oxide transistor includes a first oxide active layer. The first oxide active layer includes a first drain region and a first source region. The first conductive layer includes a first drain electrode and a first source electrode. The first drain electrode is connected to the first drain region through a first via hole. The first source electrode is connected to the first source region through a second via hole. The first polycrystalline silicon transistor includes a first polycrystalline silicon active layer. The first polycrystalline silicon active layer includes a second drain region and a second source region. The second conductive layer includes a second drain electrode and a second source electrode. The second drain electrode is connected to the second drain region through a third via hole. The second source electrode is connected to the second source region through a fourth via hole. Wherein, the second conductive layer is located on a side of the first polycrystalline silicon active layer, the first conductive layer is located between the first polycrystalline silicon active layer and the second conductive layer, and the first oxide active layer is located between the first polycrystalline silicon active layer and the first conductive layer.

On the basis of the first aspect, in a first embodiment of the first aspect, a first gate electrode of the first oxide transistor is located between the first drain electrode and the first source electrode, and the first gate electrode of the first oxide transistor is located on the first conductive layer.

On the basis of the first embodiment of the first aspect, in a second embodiment of the first aspect, the display panel further includes a third conductive layer located between the first polycrystalline silicon active layer and the first oxide active layer, and the third conductive layer includes a second gate electrode of the first polycrystalline silicon active layer, a third gate electrode of the first oxide active layer, and a wiring of the third gate electrode connected to the third gate electrode.

On the basis of the second embodiment of the first aspect, in a third embodiment of the first aspect, in a non-display region of the display panel, the first conductive layer includes a first gate electrode wiring connected to the first gate electrode, and the first gate electrode wiring is connected to the third gate electrode through a fifth via hole, and wherein the fifth via hole is located on the non-display region.

On the basis of the second embodiment of the first aspect, in a fourth embodiment of the first aspect, the third conductive layer the third conductive layer includes a first capacitive plate, the first capacitive plate is electrically connected to one of the first drain electrode or the first source electrode of the first oxide transistor and the second gate electrode of the first polycrystalline silicon transistor.

On the basis of the fourth embodiment of the first aspect, in a fifth embodiment of the first aspect, the display panel further includes a second capacitive plate disposed on a same layer as the first oxide active layer, and an orthogonal projection of the second capacitive plate at least partially overlaps with an orthogonal projection of the first capacitive plate.

On the basis of the fifth embodiment of the first aspect, in a sixth embodiment of the first aspect, the display panel further includes a fourth conductive layer, the fourth conductive layer includes a third capacitive plate, and the third capacitive plate is electrically connected to one of the second drain electrode or the second source electrode of the first polycrystalline silicon transistor.

On the basis of the sixth embodiment of the first aspect, in a seventh embodiment of the first aspect, the display panel further includes a fourth capacitive plate disposed on a same layer as the first polycrystalline silicon active layer, and the fourth capacitive plate is electrically connected to the third capacitive plate.

On the basis of the seventh embodiment of the first aspect, in an eighth embodiment of the first aspect, the display panel includes a plurality of subpixel circuits distributed in arrays. Wherein, at least one of the subpixel circuits includes the first oxide transistor and the first polycrystalline silicon transistor.

On the basis of the eighth embodiment of the first aspect, in a ninth the subpixel circuits further include a first capacitor. A first end of the first capacitor is connected to the second gate electrode of the first polycrystalline silicon transistor and one of the first drain electrode or the first source electrode of the first oxide transistor. Wherein, the first capacitor includes at least one of the first capacitive plate, the second capacitive plate, the third capacitive plate, or the fourth capacitive plate.

On a second aspect, the present disclosure provides a display device, including the display panel of any of the aforesaid embodiments.

In the display panel and the display device provided by the present disclosure, by manufacturing the first via hole and the second via hole first, and then manufacturing the third via hole and the fourth via hole, the first via hole and the second via hole have been covered by the corresponding first drain electrode and first source electrode before performing hydrofluoric acid cleaning processes, and the first drain region and the first source region of the first oxide transistor are not affected by the hydrofluoric acid cleaning process, thereby allowing the oxide channel of the first oxide transistor to also be prevented from being affected.

DETAILED DESCRIPTION OF PREFERRED EMBODIMENTS

For making the purposes, technical solutions and effects of the present disclosure be clearer and more definite, the present disclosure will be further described in detail below. It should be understood that the specific embodiments described herein are merely for explaining the present disclosure and are not intended to limit the present disclosure.

Figure 2:
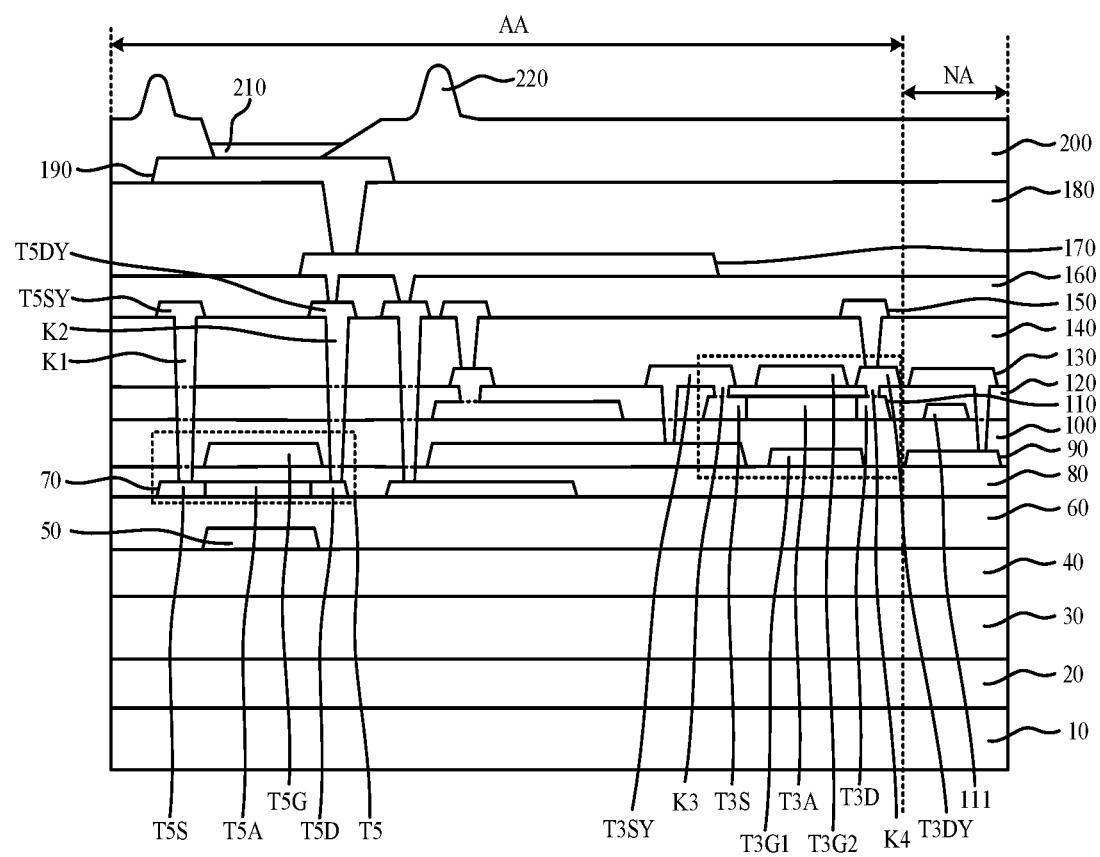
FIG. 2 is a first structural schematic diagram of a display panel provided by one embodiment of the present disclosure.

As illustrated in FIG. 2, this embodiment provides a display panel. The display panel at least includes a first oxide transistor T3, a first conductive layer 130, a first polycrystalline silicon transistor T5, and a second conductive layer 150. The first oxide transistor T3 includes a first oxide active layer 110. The first oxide active layer 110 includes a first drain region T3D, a first source region T3S, and a first oxide channel T3A. Wherein, the first drain region T3D and the first source region T3S are respectively located on two opposite sides of the first oxide channel T3A. The first conductive layer 130 includes a first drain electrode T3DY and a first source electrode T3SY. The first drain electrode T3DY is connected to the first drain region T3D through a first via hole K4. The first source electrode T3SY is connected to the first source region T3S through a second via hole K3. The first polycrystalline silicon transistor T5 includes a first polycrystalline silicon active layer 70. The first polycrystalline silicon active layer 70 includes a second drain region TSD, a second source region TSS, and a first polycrystalline silicon channel TSA. The second conductive layer 150 includes a second drain electrode TSDY and a second source electrode TSSY. The second drain electrode TSDY is connected to the second drain region T5D through a third via hole K1. The second source electrode TSSY is connected to the second source region T5S through a fourth via hole K2. Wherein, the second conductive layer 150 is located on a side of the first polycrystalline silicon active layer 70, the first conductive layer 130 is located between the first polycrystalline silicon active layer 70 and the second conductive layer 150, and the first oxide active layer 110 is located between the first polycrystalline silicon active layer 70 and the first conductive layer 130.

It should be understood that, in this embodiment, by manufacturing the first via hole K4 and the second via hole K3 first, and then manufacturing the third via hole K1 and the fourth via hole K2, the first via hole K4 and the second via hole K3 have been covered by the corresponding first drain electrode T3DY and first source electrode T3SY before performing hydrofluoric acid cleaning processes, and the first drain region T3D and the first source region T3S of the first oxide transistor T3 are not affected by the hydrofluoric acid cleaning process, thereby allowing the oxide channel T3A of the first oxide transistor T3 to also be prevented from being affected.

As illustrated in FIG. 2, in one of the embodiments, a first gate electrode T3G2 of the first oxide transistor T3 is located between the first drain electrode T3DY and the first source electrode T3SY, and the first gate electrode T3G2 of the first oxide transistor T3 is located on the first conductive layer 130. Wherein, the first drain electrode T3DY and the first source electrode T3SY are located on the first conductive layer 130, and the first gate electrode T3G2 is located between the first drain electrode T3DY and the first source electrode T3SY.

As illustrated in FIG. 2, in one of the embodiments, the display panel further includes a third conductive layer 90 located between the first polycrystalline silicon active layer 70 and the first oxide active layer 110, and the third conductive layer 90 includes a second gate electrode T5G of the first polycrystalline silicon active layer T5, a third gate electrode T3G1 of the first oxide active layer T3, and a third gate electrode wiring (not shown in the figure) connected to the third gate electrode T3G1.

It should be noted that the first oxide transistor T3 is a double-gate thin film transistor, having the first gate electrode T3G2 and the third gate electrode T3G1. Orthogonal projections of the third gate electrode wiring (not shown in the figure) connected to the third gate electrode T3G1 and the first gate electrode T3G2 at least partially overlap with each other on a thickness direction of the display panel. Wherein, the display panel further includes a metal wiring 111 disposed on a same layer as the first oxide active layer 110. Orthogonal projections of the metal wiring 111, the third gate electrode wiring (not shown in the figure), and/or the first gate electrode T3G2 at least partially overlap with each other on the thickness direction of the display panel.

As illustrate in FIG. 2, in one of the embodiments, the display panel includes a display region AA and a non-display region NA. In the non-display region NA, the first conductive layer 130 further includes a first gate electrode wiring (not shown in the figure) connected to the first gate electrode T3G2. The first gate electrode wiring is connected to the third gate electrode wiring through a fifth via hole (not shown in the figure). Wherein, at least one of the first gate electrode wiring, the fifth via hole, or the third gate electrode wiring is located on the non-display region NA. It should be noted that the fifth via hole is located on the non-display region NA and is away from the display region AA. Wherein, the non-display region NA can be but is not limited to a pad region in a lateral bezel region of the display panel.

It can be understood that by electrically connecting the first gate electrode T3G2 of the first oxide transistor T3 to the third gate electrode T3G1 in the non-display region NA, a number of corresponding connecting wires and opened overlapping holes in the display region AA can be reduced, which is conducive to increasing a pixel density (pixels per inch, PPI) of the display panel.

As illustrated in FIG. 2, in one of the embodiments, the display panel further includes a first insulation layer 120. The first insulation layer 120 is located between the first oxide active layer 110 and the first conductive layer 130.

As illustrated in FIG. 2, in one of the embodiments, the display panel further includes a second insulation layer 140. The second insulation layer 140 is located between the first conductive layer 130 and the second conductive layer 150.

As illustrated in FIG. 2, in one of the embodiments, the display panel further includes a third insulation layer 100. The third insulation layer 100 is located between the first oxide active layer 110 and the first polycrystalline silicon active layer 70.

As illustrated in FIG. 2, in one of the embodiments, the display panel further includes fourth insulation layer 80. The fourth insulation layer 80 is located between the third conductive layer 90 and the first polycrystalline silicon active layer 70.

As illustrated in FIG. 2, in one of the embodiments, the display panel further includes a first substrate layer 10, a barrier layer 20, a second substrate layer 30, a first buffer layer 40, a light shielding layer 50, and a second buffer layer 60 which are laminated sequentially. Wherein, the first polycrystalline silicon active layer 70 is disposed on one side of the second buffer layer 60 and away from the first substrate layer 10. An orthogonal projection of the light shielding layer 50 on the first substrate 10 at least partially overlaps with an orthogonal projection of the first polycrystalline silicon channel T5A on the first substrate 10. Furthermore, the orthogonal projection of the light shielding layer 50 on the first substrate 10 overlaps with the orthogonal projection of the first polycrystalline silicon channel T5A on the first substrate 10. Furthermore, an area of the orthogonal projection of the light shielding layer 50 of the first substrate 10 is larger than an area of the orthogonal projection of the first polycrystalline silicon channel T5A on the first substrate 10, and the light shielding layer 50 is disposed corresponding to the first polycrystalline silicon channel TSA. Wherein, the barrier layer 20 can be an inorganic layer.

Wherein, materials of the first substrate 10 and the second substrate 30 are same, and both are polyimide.

As illustrated in FIG. 2, in one of the embodiments, the display panel further includes a fifth insulation layer 160.

The fifth insulation layer 160 is located on one side of the second conductive layer 150 and away from the first conductive layer 130. Wherein, a material of the fifth insulation layer 160 can adopt but is not limited to silica, and silicon nitride can also be adopted.

As illustrated in FIG. 2, in one of the embodiments, the display panel further includes a fourth conductive layer 170. The fourth conductive layer 170 is located on one side of the fifth insulation layer 160 and away from the first conductive layer 130.

As illustrated in FIG. 2, in one of the embodiments, the display panel further includes a planarization layer 180. The planarization layer 180 is located on one side of the fourth conductive layer 170 and away from the first conductive layer 130.

Figure 4:
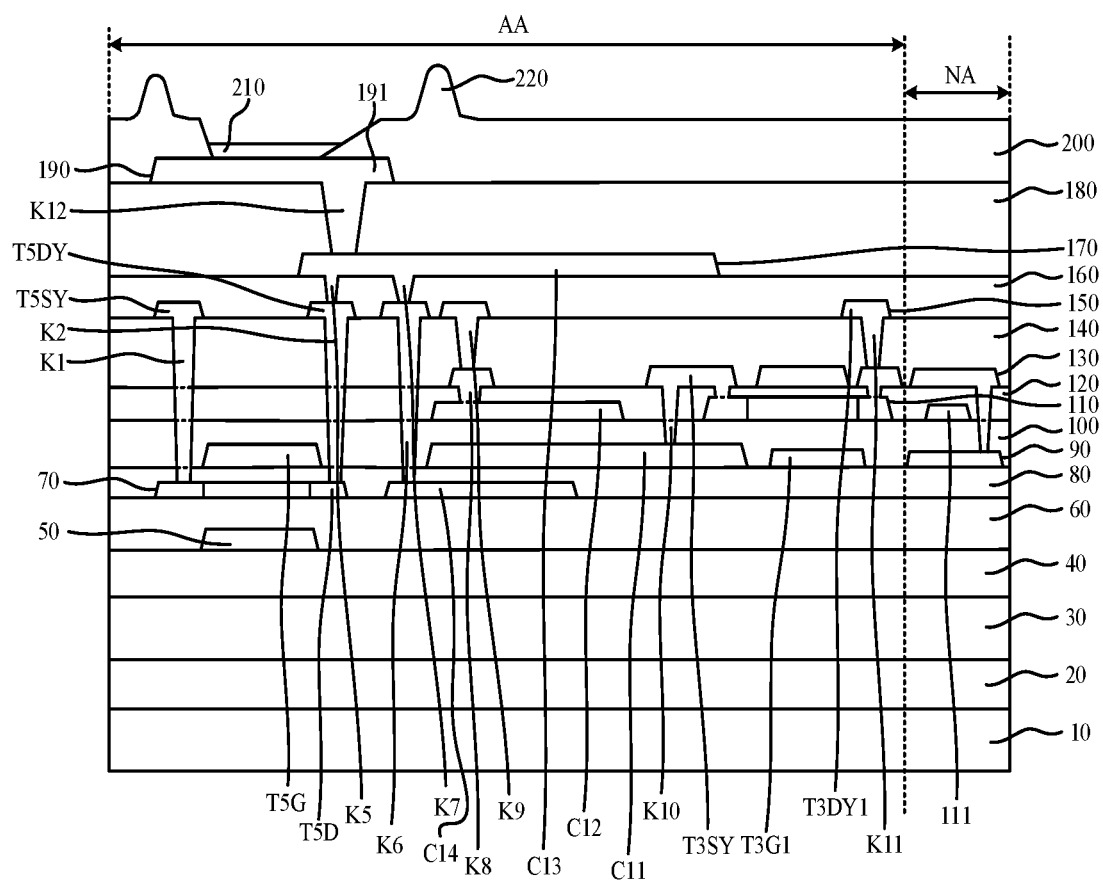
FIG. 4 is a second structural schematic diagram of the display panel provided by one embodiment of the present disclosure.

As illustrated in FIG. 4, in one of the embodiments, the display panel further includes at least one anode 191 located in an anode layer 190. The anode layer 190 is located on one side of the planarization layer 180 and away from the first conductive layer 130.

As illustrated in FIG. 2, in one of the embodiments, the display panel further includes a pixel definition layer 200. The pixel definition layer 200 is located on one side of the anode layer 190 and away from the first conductive layer 130. Wherein, the pixel definition layer 200 has at least one opening. A light emitting functional layer 210 is disposed in the opening.

As illustrated in FIG. 2, in one of the embodiments, the display panel further includes at least two pillars 220. The two pillars 220 are located on one side of the pixel definition layer 200 and away from the first conductive layer 130. The two pillars 220 are located on two opposite sides of the aforesaid openings.

Figure 3:
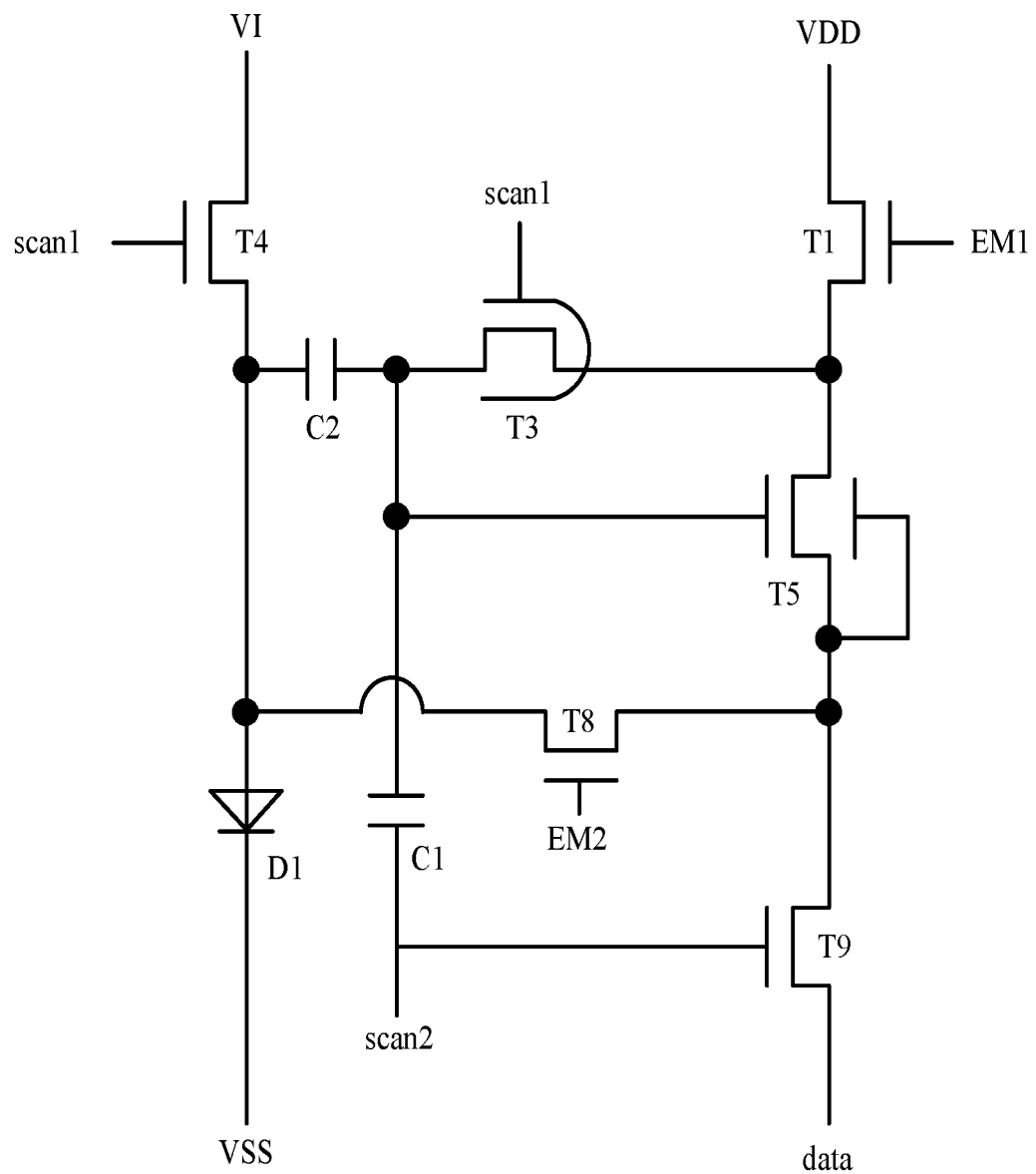
FIG. 3 is a structural schematic diagram of a subpixel circuit provided by one embodiment of the present disclosure.

As illustrated in FIG. 3, in one of the embodiments, the display panel includes a plurality of subpixel circuits distributed in arrays. Wherein, at least one of the subpixel circuits includes the first oxide transistor T3 and the first polycrystalline silicon transistor T5, the first gate electrode T3G2 of the first oxide transistor T3 is connected to the third gate electrode T3G1 of the first oxide transistor T3 to simultaneously receive a first scanning signal scan 1. One of a drain electrode or a source electrode of the first oxide transistor T3 is connected to one of a drain electrode or a source electrode of the first polycrystalline silicon transistor T5. The other one of the drain electrode or the source electrode of the first oxide transistor T3 is connected to the second gate electrode T5G of the first polycrystalline silicon transistor T5.

It can be understood that in the subpixel circuit, the first polycrystalline silicon transistor T5 acts as a driving transistor, and the first oxide transistor T3 can reduce a leakage current of the gate electrode of the driving transistor.

As illustrate in FIG. 3, in one of the embodiments, the subpixel circuits further include a first light emitting control transistor T1. One of a drain electrode or a source electrode the first light emitting control transistor T1 is configured to receive a first power supply signal VDD. The other one of the drain electrode or the source electrode of the first light emitting control transistor T1 is connected to one of the drain electrode or the source electrode of the first polycrystalline silicon transistor T5 and one of the drain electrode or the source electrode of the first oxide transistor T3. A gate electrode of the first light emitting control transistor T1 is configured to receive a first light emitting control signal EM1.

As illustrate in FIG. 3, in one of the embodiments, the subpixel circuits further include a second light emitting control transistor T8. One of a drain electrode or a source electrode of the second light emitting control transistor T8 is connected to the other one of the drain electrode or the source electrode of the first polycrystalline silicon transistor T5. A gate electrode of the second light emitting control transistor T8 is configured to receive a second light emitting control signal EM2.

As illustrate in FIG. 3, in one of the embodiments, the subpixel circuits further include a light emitting device D1. An anode of the light emitting device D1 is connected to the other one of the drain electrode or the source electrode of the second light emitting control transistor T8. A cathode of the light emitting device D1 is connected to a second power supply signal VSS. Wherein, the light emitting device D1 can be but is not limited to organic light emitting diodes (OLEDs), and can also be mini light emitting diodes (mini-LEDs), and can further be micro light emitting diodes (micro-LEDs).

As illustrated in FIG. 3, in one of the embodiments, the subpixel circuits further include an initialization transistor T4. One of a drain electrode or a source electrode of the initialization transistor T4 is configured to receive an initialization signal VI. The other one of the drain electrode or the source electrode of the initialization transistor T4 is connected to the anode of the light emitting device D1. A gate electrode of the initialization transistor T4 receives the first scanning signal scant.

As illustrated in FIG. 3, in one of the embodiments, the subpixel circuits further include a writing transistor T9. One of a drain electrode or a source electrode of the writing transistor T9 is configured to receive a data signal data. The other one of the drain electrode or the source electrode of the writing transistor T9 is connected to one of the drain electrode or the source electrode of the second light emitting control transistor T8.

As illustrate in FIG. 3, in one of the embodiments, the subpixel circuits further include a first capacitor C1. A first end of the first capacitor C1 is connected to the gate electrode of the writing transistor T9. The gate electrode of the writing transistor T9 is configured to receive a second scanning signal scan2. A second end of the first capacitor C1 and a second gate electrode of the first polycrystalline silicon transistor T5 are connected to the other one of the drain electrode or the source electrode of the first oxide transistor T3.

As illustrated in FIG. 3, in one of the embodiments, the subpixel circuits further include a second capacitor C2. A first end of the second capacitor C2 is connected to the second end of the first capacitor C1. A second end of the second capacitor C2 is connected to the anode of the light emitting device D1.

As illustrated in FIG. 3, in one of the embodiments, the first polycrystalline silicon transistor T5 further includes a fourth gate electrode. The fourth gate electrode of the first polycrystalline silicon transistor T5 is connected to the other one of the drain electrode or the source electrode of the first polycrystalline silicon transistor T5.

As illustrated in FIG. 3, in one of the embodiments, the first polycrystalline silicon transistor T5 can be but is not limited to a low-temperature polycrystalline-silicon thin film transistor. The first oxide transistor T3 can be but is not limited to a metal oxide thin film transistor.

As illustrated in FIG. 3, in one of the embodiments. An electric potential of the first power supply signal VDD is higher than an electric potential of the second power supply signal VSS.

As illustrated in FIG. 3, in one of the embodiments, channel types of the first oxide transistor T3, the first polycrystalline silicon transistor T5, the first light emitting control transistor T1, the second light emitting control transistor T8, the initialization transistor T4, and the writing transistor T9 are same. Specifically, the first oxide transistor T3, the first polycrystalline silicon transistor T5, the first light emitting control transistor T1, the second light emitting control transistor T8, the initialization transistor T4, and the writing transistor T9 can be but are not limited to N-type channel thin film transistors and can also be P-type channel thin film transistors.

In one of the embodiments, a capacitance of the first capacitor C1 is larger than a capacitance of the second capacitor C2.

As illustrated in FIG. 4, in one of the embodiments, the third conductive layer 90 further includes a first capacitive plate C11. The first capacitive plate C11 is located between the second gate electrode T5G of the first polycrystalline silicon transistor T5 and the third gate electrode T3G1 of the first oxide transistor T3. The first capacitive plate C11 is connected to the first source electrode T3SY through a tenth via hole K10. The display panel further includes a second capacitive plate C12 disposed on a same layer as the first oxide active layer 110. The second capacitive plate C12 is connected to the second conductive layer 150 with wiring through an eighth via hole K8 and a ninth via hole K9 in sequence. The fourth conductive layer 170 includes a third capacitive plate C13. The third capacitive plate C13 is connected to the second drain electrode TSDY through a fifth via hole K5. At the same time, the third capacitive plate C13 is connected to a metal wiring C14 disposed on a same layer as the first polycrystalline silicon active layer 70 through a seventh via hole K7 and a sixth via hole K6 in sequence.

An anode 191 is connected to the third capacitive plate C13 through a twelfth via hole K12.

As illustrated in FIG. 4, in one of the embodiments, the second conductive layer 150 further includes a third drain region T3DY1. The third drain region T3DY1 is connected to the first drain electrode T3DY through an eleventh via hole K11.

It should be noted that the first capacitive plate C11, the second capacitive plate C12, the third capacitive plate C13, and the metal wiring C14 together constitute the first capacitor C1 illustrated in FIG. 3.

Figure 1:
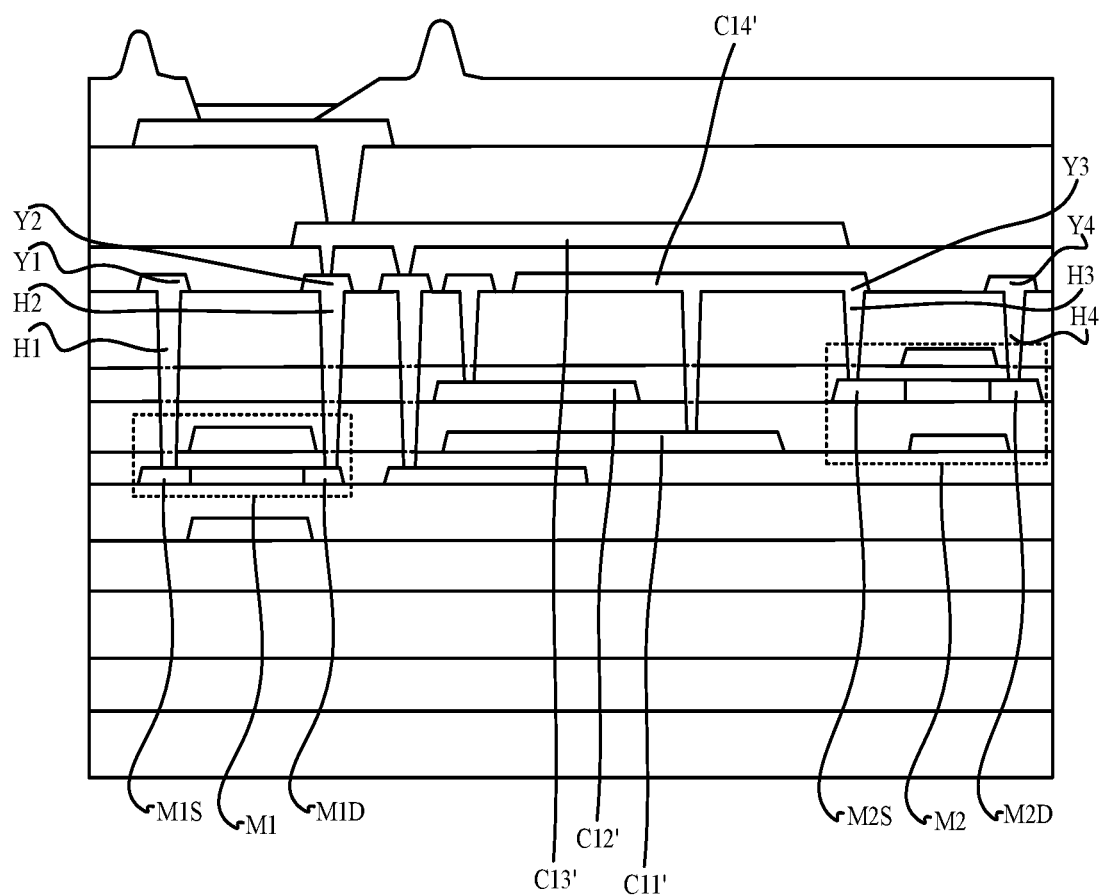
FIG. 1 is a structural schematic diagram of a display panel of a traditional technical solution.
Figure 5:
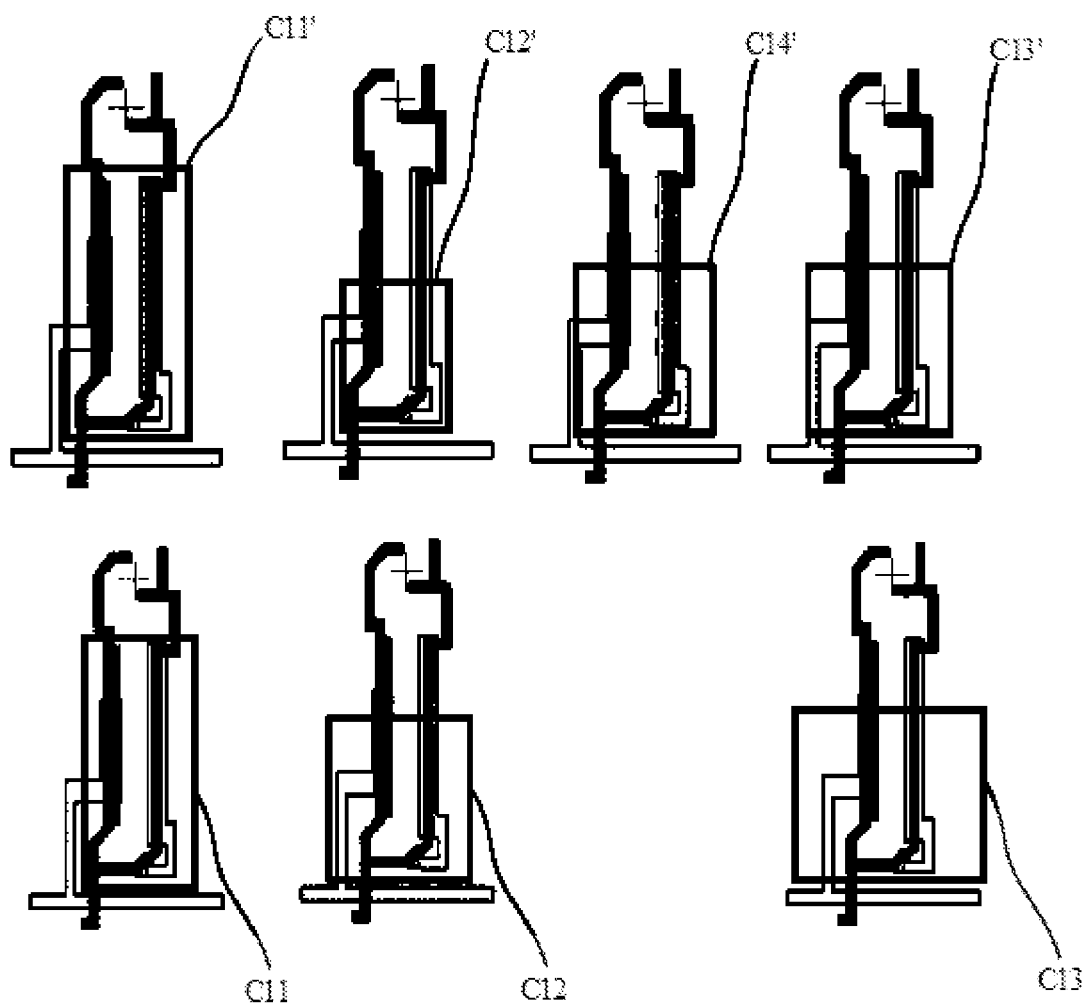
FIG. 5 is a schematic diagram of structural comparison of corresponding parts in FIG. 1 and FIG. 4.

As illustrated in FIG. 1, FIG. 4, and FIG. 5, compared to the structure in FIG. 1, in the embodiment illustrated in FIG. 4, because there are not too many wirings on the second conductive layer 150, for example, a capacitive plate C14' in FIG. 1 is omitted, so the capacitance of the first capacitor C1 is reduced. On the basis of this, in this embodiment, the area of the first capacitive plate C11 in FIG. 4 is reduced. The second capacitive plate C12 includes a second sub-capacitive plate and a second sub-compensation plate integrated in one piece. Wherein, an area of the second sub-capacitive plate is as same as or similar to an area of an element C12' in FIG. 1. The third capacitive plate C13 includes a third sub-capacitive plate and a third sub-compensation plate integrated in one piece. Wherein, an area of the third sub-capacitive plate is as same as or similar to an area of an element C13' in FIG. 1.

In summary, comparing C11', C12', and C13' in FIG. 1 to the first capacitive plate C11, the second capacitive plate C12, and the third capacitive plate C13 in FIG. 4, the first capacitive plate C11 is limited by the space layout compared to C11' in FIG. 1, which reduces the area of the first capacitive plate C11, while the area of the second capacitive plate C12 is increased compared to C12' in FIG. 1, and the area of the third capacitive plate C13 is increased compared to C13' in FIG. 1. For the changes of each capacitive plate please refer to FIG. 5. It can be understood that due to the change of the aforesaid structure in this embodiment, in order to maintain the capacitance of the first capacitor C1, each of the capacitive plates constituting the first capacitor C1 are adjusted correspondingly according to the arrangement space. The adjustment process is complicated, which is obviously beyond the normal foreseeable scope for those skilled in the art. It is impossible to obtain the first capacitor C1 with a suitable capacitance without creative work and numerous experiments.

It should be noted that the first capacitor C1 is equivalent of the capacitive plates constituting thereof. It is not just simply made from two capacitive plates in physics.

In one of the embodiments, the present disclosure provides a manufacturing method of the display panel, including following steps: manufacturing the first polycrystalline silicon active layer, wherein the first polycrystalline silicon active layer includes the second drain region and the second source region of the first polycrystalline silicon transistor; manufacturing the first oxide active layer on one side of the first polycrystalline silicon active layer, wherein the first polycrystalline silicon active layer includes the first drain region and the first source region of the first oxide transistor; manufacturing the first insulation layer on one side of the first oxide active layer away from the first polycrystalline silicon active layer; manufacturing the first via hole and the second via hole; manufacturing the first conductive layer on one side of the first insulation layer away from the first polycrystalline silicon active layer, wherein the first conductive layer includes the first drain electrode and the first source electrode, the first drain electrode is connected to the first drain region through the first via hole, and the first source electrode is connected to the first source region through the second via hole; manufacturing the second insulation layer on one side of the first conductive layer away from the first polycrystalline silicon active layer; and manufacturing the third via hole and the fourth via hole, wherein the third via hole is connected to the second drain region, and the third via hole is connected to the second source region.

In the manufacturing method, it can be understood that by manufacturing the first via hole and the second via hole first, and then manufacturing the third via hole and the fourth via hole, the first via hole and the second via hole have been covered by the corresponding first drain electrode and first source electrode before performing hydrofluoric acid cleaning processes, and the first drain region and the first source region of the first oxide transistor are not affected by the hydrofluoric acid cleaning process, thereby allowing the oxide channel of the first oxide transistor to also be prevented from being affected.

In one of the embodiments, the present disclosure provides a display device, including any of the display panel of the aforesaid embodiment.

In the display device, it can be understood that by manufacturing the first via hole and the second via hole first, and then manufacturing the third via hole and the fourth via hole, the first via hole and the second via hole have been covered by the corresponding first drain electrode and first source electrode before performing hydrofluoric acid cleaning processes, and the first drain region and the first source region of the first oxide transistor are not affected by the hydrofluoric acid cleaning process, thereby allowing the oxide channel of the first oxide transistor to also be prevented from being affected.

It can be understood, that for those of ordinary skill in the art, various other corresponding changes and modifications can be made according to the technical solutions and technical ideas of the present disclosure, and all such changes and modifications are intended to fall within the scope of protection of the claims of the present disclosure.

What is claimed is:

1. A display panel, comprising:
  a first oxide transistor, wherein the first oxide transistor comprises a first oxide active layer, the first oxide active layer comprises a first drain region, a first source region, and a first oxide channel, and the first oxide channel is located between the first drain region and the first source region;
  a first conductive layer, wherein the first conductive layer comprises a first drain electrode and a first source electrode, the first drain electrode is connected to the first drain region through a first via hole, and the first source electrode is connected to the first source region through a second via hole;
  a first polycrystalline silicon transistor, wherein the first polycrystalline silicon transistor comprises a first polycrystalline silicon active layer, and the first polycrystalline silicon active layer comprises a second drain region and a second source region;
  a second conductive layer, wherein the second conductive layer comprises a second drain electrode and a second source electrode, the second drain electrode is connected to the second drain region through a third via hole, and the second source electrode is connected to the second source region through a fourth via hole, and
  a third conductive layer, a top surface of the third conductive layer is lower than a top surface of the first oxide active layer, and a bottom surface of the third conductive layer is higher than a bottom surface of the first polycrystalline silicon active layer;
  wherein the second conductive layer is located on a side of the first polycrystalline silicon active layer, a top surface of the first conductive layer is lower than a top surface of the second conductive layer, a bottom surface of the first conductive layer is higher than a bottom surface of the first polycrystalline silicon active layer, and the first oxide active layer is located between the first polycrystalline silicon active layer and the first conductive layer,
  wherein a first gate electrode of the first oxide transistor is located between the first drain electrode and the first source electrode, the first gate electrode of the first oxide transistor is disposed on a same layer as the first conductive layer.

2. The display panel as claimed in claim 1, wherein the third conductive layer comprises a second gate electrode of the first polycrystalline silicon active layer, a third gate electrode of the first oxide active layer, and a wiring of the third gate electrode connected to the third gate electrode.

3. The display panel as claimed in claim 2, wherein, in a non-display region of the display panel, the first conductive layer comprises a first gate electrode wiring connected to the first gate electrode, and the first gate electrode wiring is connected to the third gate electrode through a fifth via hole, and wherein the fifth via hole is located on the non-display region.

4. The display panel as claimed in claim 2, wherein the third conductive layer further comprises a first capacitive plate, and the first capacitive plate is electrically connected to one of the first drain electrode or the first source electrode of the first oxide transistor and the second gate electrode of the first polycrystalline silicon transistor.

5. The display panel as claimed in claim 4, wherein the display panel further comprises a second capacitive plate disposed on a same layer as the first oxide active layer, and an orthogonal projection of the second capacitive plate at least partially overlaps with an orthogonal projection of the first capacitive plate.

6. The display panel as claimed in claim 5, wherein the display panel further comprises a fourth conductive layer, the fourth conductive layer comprises a third capacitive plate, and the third capacitive plate is electrically connected to one of the second drain electrode or the second source electrode of the first polycrystalline silicon transistor.

7. The display panel as claimed in claim 6, wherein the display panel further comprises a fourth capacitive plate disposed on a same layer as the first polycrystalline silicon active layer, and the fourth capacitive plate is electrically connected to the third capacitive plate.

8. The display panel as claimed in claim 7, wherein the display panel further comprises a plurality of subpixel circuits distributed in arrays, and wherein at least one of the subpixel circuits comprises the first oxide transistor and the first polycrystalline silicon transistor.

9. A display panel, comprising:
a first oxide transistor, wherein the first oxide transistor comprises a first oxide active layer, the first oxide active layer comprises a first drain region and a first source region;
a first conductive layer, wherein the first conductive layer comprises a first drain electrode and a first source electrode, the first drain electrode is connected to the first drain region through a first via hole, and the first source electrode is connected to the first source region through a second via hole;
a first polycrystalline silicon transistor, wherein the first polycrystalline silicon transistor comprises a first polycrystalline silicon active layer, and the first polycrystalline silicon active layer comprises a second drain region and a second source region;
a second conductive layer, wherein the second conductive layer comprises a second drain electrode and a second source electrode, the second drain electrode is connected to the second drain region through a third via hole, and the second source electrode is connected to the second source region through a fourth via hole, and
a third conductive layer, a top surface of the third conductive layer is lower than a top surface of the first oxide active layer, and a bottom surface of the third conductive layer is higher than a bottom surface of the first polycrystalline silicon active layer;
wherein the second conductive layer is located on a side of the first polycrystalline silicon active layer, a top surface of the first conductive layer is lower than a top surface of the second conductive layer, a bottom surface of the first conductive layer is higher than a bottom surface of the first polycrystalline silicon active layer, and the first oxide active layer is located between the first polycrystalline silicon active layer and the first conductive layer,
wherein a first gate electrode of the first oxide transistor is located between the first drain electrode and the first source electrode, the first gate electrode of the first oxide transistor is disposed on a same layer as the first conductive layer.

10. The display panel as claimed in claim 9, wherein the third conductive layer comprises a second gate electrode of the first polycrystalline silicon active layer, a third gate electrode of the first oxide active layer, and a wiring of the third gate electrode connected to the third gate electrode.

11. The display panel as claimed in claim 10, wherein, in a non-display region of the display panel, the first conductive layer comprises a first gate electrode wiring connected to the first gate electrode, and the first gate electrode wiring is connected to the third gate electrode through a fifth via hole, and wherein the fifth via hole is located on the non-display region.

12. The display panel as claimed in claim 10, wherein the third conductive layer further comprises a first capacitive plate, and the first capacitive plate is electrically connected to one of the first drain electrode or the first source electrode of the first oxide transistor and the second gate electrode of the first polycrystalline silicon transistor.

13. The display panel as claimed in claim 12, wherein the display panel further comprises a second capacitive plate disposed on a same layer as the first oxide active layer, and an orthogonal projection of the second capacitive plate at least partially overlaps with an orthogonal projection of the first capacitive plate.

14. The display panel as claimed in claim 13, wherein the display panel further comprises a fourth conductive layer, the fourth conductive layer comprises a third capacitive plate, and the third capacitive plate is electrically connected to one of the second drain electrode or the second source electrode of the first polycrystalline silicon transistor.

15. The display panel as claimed in claim 14, wherein the display panel further comprises a fourth capacitive plate disposed on a same layer as the first polycrystalline silicon active layer, and the fourth capacitive plate is electrically connected to the third capacitive plate.

16. The display panel as claimed in claim 15, wherein the display panel further comprises a plurality of subpixel circuits distributed in arrays, and wherein at least one of the subpixel circuits comprises the first oxide transistor and the first polycrystalline silicon transistor.

17. The display panel as claimed in claim 16, wherein the subpixel circuits further comprise a first capacitor, a first end of the first capacitor is connected to the second gate electrode of the first polycrystalline silicon transistor and one of the first drain electrode or the first source electrode of the first oxide transistor, and
wherein the first capacitor comprises at least one of the first capacitive plate, the second capacitive plate, the third capacitive plate, or the fourth capacitive plate.

18. A display device, comprising the display panel as claimed in claim 9.

* * * * *